United States Patent [19]

Chappell et al.

[11] Patent Number: 4,719,372

[45] Date of Patent: Jan. 12, 1988

[54] MULTIPLYING INTERFACE CIRCUIT FOR LEVEL SHIFTING BETWEEN FET AND TTL LEVELS

[75] Inventors: Barbara A. Chappell, Amawalk; Stanley E. Schuster, Granite Springs, both of N.Y.

[73] Assignee: International Business Machines Corporation, Armonk, N.Y.

[21] Appl. No.: 825,420

[22] Filed: Feb. 3, 1986

[51] Int. Cl.[4] .................. H03K 17/16; H03K 19/094; H03K 19/092; H03L 5/00

[52] U.S. Cl. .................... 307/475; 307/443; 307/450; 307/264

[58] Field of Search ............. 307/443, 450, 451, 264, 307/585, 475, 481

[56] References Cited

FOREIGN PATENT DOCUMENTS 8204364 12/1982 PCT Int'l Appl ............... 307/443

OTHER PUBLICATIONS

I.B.M. Tech. Disc. Bul., "Level Shifting Circuit", Freeman et al.
I.B.M. Tech. Disc. Bul., "Field Effect Transistor Interface Circuit", Elder and Puri.

Primary Examiner—John S. Heyman
Assistant Examiner—M. R. Wambach
Attorney, Agent, or Firm—John J. Goodwin

[57] ABSTRACT

An interface circuit for use as a circuit interface between bipolar ECL logic circuits and field effect transistor circuits. The interface circuit includes an amplifier circuit having an enhancement level shifting and enhancement multiplier device wherein sensitivity to device threshold variations are essentially eliminated. The level shifting portion of the amplifier comprises a load device plus an enhancement type input field effect transistor having a common drain and gate and with its source connected to the incoming ECL level. In dual rail operation, the load device has its gate modulated by the complement of the incoming signal. The output of this stage is the ECL signal shifted upwards by slightly more than the enhancement threshold voltage, making it possible to drive the next multiplier stage without use of any depletion implant. The level shifted signal is applied to the gate of another enhancement device in the multiplier stage, with the complement ECL signal applied to the second enhancement device source electrode. The ECL signal is also used to drive the gate of another load device in the multiplier stage. A drive stage may be added to the combination of the level shifter and multiplier to provide a full output voltage level.

7 Claims, 9 Drawing Figures

ECL/FET
INTERFACE
PRIOR ART

MULTIPLYING INTERFACE CIRCUIT FOR LEVEL SHIFTING BETWEEN FET AND TTL LEVELS

BACKGROUND OF THE INVENTION

Field of the Invention

The present invention relates to field effect transistor (FET) circuits for converting input ECL transistor logic levels to FET logic levels. More particularly, the present invention relates to an FET interface circuit including an enhancement device which converts either a dual rail or a single rail ECL chip select signal to an FET voltage level and single rail ECL address and data-in signals to true and complement FET voltage levels for use in FET semiconductor memories.

It is also intended that the same FET circuit can be used as an interface between small signal levels and FET semiconductor logic or memory devices in a synchronous or an asynchronous system.

Transistor memories fabricated by MOS fabrication techniques experience delays in memory access due to the limitations of MOS technologies. Efforts have been successful in reducing delay inherent with this technology. A typical drive for FET memories is accomplished with transistor-transistor logic, TTL, which can swing from 0 to 5 volts. The large voltage swing results in large current swings di/dt on the leads driving the FET memory array.

As the operational speed of reading and writing FET memory arrays has increased, these current swings have produced an external limitation on the signals used to drive the memory chips, while the actual internal access time of the memory has decreased from more than 100 ns to less than 20 ns. Increasing the speed of the input signals in an attempt to keep up with increasing memory speed results in more noise from large di/dt current changes and lead inductance which reduces the overall reliability of the memory system.

Emitter coupled logic (ECL) operates at much higher switching rates than TTL. Emitter coupled logic provides a nominal excursion between logic levels of ±0.5 volts, and worse case conditions a total peak to peak voltage excursion of 0.6 volts, with the possibility of only 0.1 volts of signals above and below the reference level, far less than the required drive levels for FET circuits. The present invention is directed to coupling low level, fast switching ECL voltage levels to FET circuits.

One approach to the foregoing problem is described in *Electronics*, Sept. 9, 1985, at page 94. The article describes an ECL to CMOS interface which uses BIMOS, a mixture of CMOS and bipolar technology to manufacture a single memory chip. The multiple process steps of integrating bipolar and CMOS technologies is necessarily complex and expensive and thus undesirable.

Another example of a bipolar logic level to FET logic level interface circuit is described in *IBM Technical Bulletin*, Volume 19, No. 8, January 1977, pages 2953-2954. This circuit provides a clocked circuit for receiving input ECL or TTL logic levels. This circuit requires three timing signals to couple the logic signals on the input modes to higher voltages suitable for driving an FET array. No method for converting the timing signals from ECL levels to the required FET voltage levels is given.

An example of an ECL to CMOS interface circuit using only CMOS devices is described in the *Extended Abstracts of the 17th Conference on Solid State Devices and Materials*, Tokyo, 1985, pp. 53-56. This interface circuit uses an input stage to shift the ECL signal by an adjustable amount in order to drive a standard CMOS inverter. The amount of level shifting is supplied by a feed-back control circuit which compensates for variations in threshold and power supply shifts. A considerable number of devices are involved in this control circuit which must match the devices in the interface circuit and which may dissipate DC power. Since there will need to be several interface circuits for one control circuit, the interface circuit may be physically remote from the control circuit and across-chip device mis-matches could be substantial for typical CMOS processes. Similarly, on-chip power supply distribution may result in different supply values at the control circuit than at the interface circuit. Thus, interfacing the very small signals typical to high speed systems (on the order of 100 mV) could be a problem. In addition, since only a very small swing is available to drive the inverter and since no means for differential drive is supplied, the delay through the interface circuit is larger than would be expected with a differentially driven circuit. Attempts to mitigate the across-chip matching problem through use of larger than minimum channel lengths would further degrade performance.

In a copending patent application entitled ECL TO FET INTERFACE CIRCUIT FOR FIELD EFFECT TRANSISTOR ARRAYS, Ser. No. 06/789,884 filed Oct. 10, 1985 in the name of S. E. Schuster an interface circuit for coupling bipolar logic circuit output signals to an FET logic array is described. The interface receives chip select signals and their complement on a dual rail input line. A small signal amplifier comprising an FET amplifier having an input FET transistor connected through its source and gate to the dual rail input terminals, converts the chip enable signal to a high level clocking signal. An FET dynamic sense amplifier receives a bipolar logic level to be converted to an FET logic level, and receives a reference level from the bipolar transistor logic circuit. Upon clocking of the dynamic sense amplifier by the small signal multiplier, the true and complementary FET logic levels corresponding to the input bipolar logic levels are provided by the dynamic sense amplifier.

The small signal multiplier includes a depletion device and thus requires an additional implant. With minimum negative gate-to-source voltage the device should be at threshold, therefore a depletion implant is needed. Variations in the depletion threshold voltage of the depletion device are directly reflected in the minimum amplitude of the input ECL level that can be detected. Also, since the circuit includes a depletion device, its operation is limited to dual rail applications.

The present invention is distinct in that it provides a means for shifting the ECL input level by slightly more than an enhancement device threshold so that an additional implant is not required. In addition, the sensitivities to threshold voltage variations are almost completely eliminated. The present invention employs enhancement devices and therefore, may be used with memories and logic circuits with both dual rail and single rail operation.

SUMMARY OF THE INVENTION

It is an object of the invention to provide an improved interface circuit for use as a circuit interface between bipolar ECL logic circuits and field effect transistor circuits.

It is a more specific object of the invention to provide an improved amplifier circuit including an enhancement level shifting and enhancement multiplier device, for use in interface circuits which can be driven with ECL voltage levels and wherein sensitivity to device threshold and conductance and power supply voltage variations are essentially eliminated.

These and other objects are provided by an interface circuit in accordance with the invention. The interface circuit includes an amplifier circuit which can provide a single ended FET logic level in response to either a dual rail signal or a single rail clock and a reference.

The interface circuit can be used to interface with the address or data inputs of an FET memory. The interface may include at least one sense amplifier having a reference input and logic level input connected to receive an ECL reference and logic level. The sense amplifier is clocked by the unclocked amplifier circuit to provide an FET logic level and the complement thereof.

In a preferred embodiment of the invention, the level shifting portion of the amplifier comprises a load plus an enhancement type input field effect transistor having a common drain and gate and with its source connected to the incoming ECL level.

DESCRIPTION OF THE PREFERRED EMBODIMENT

Figure 1:
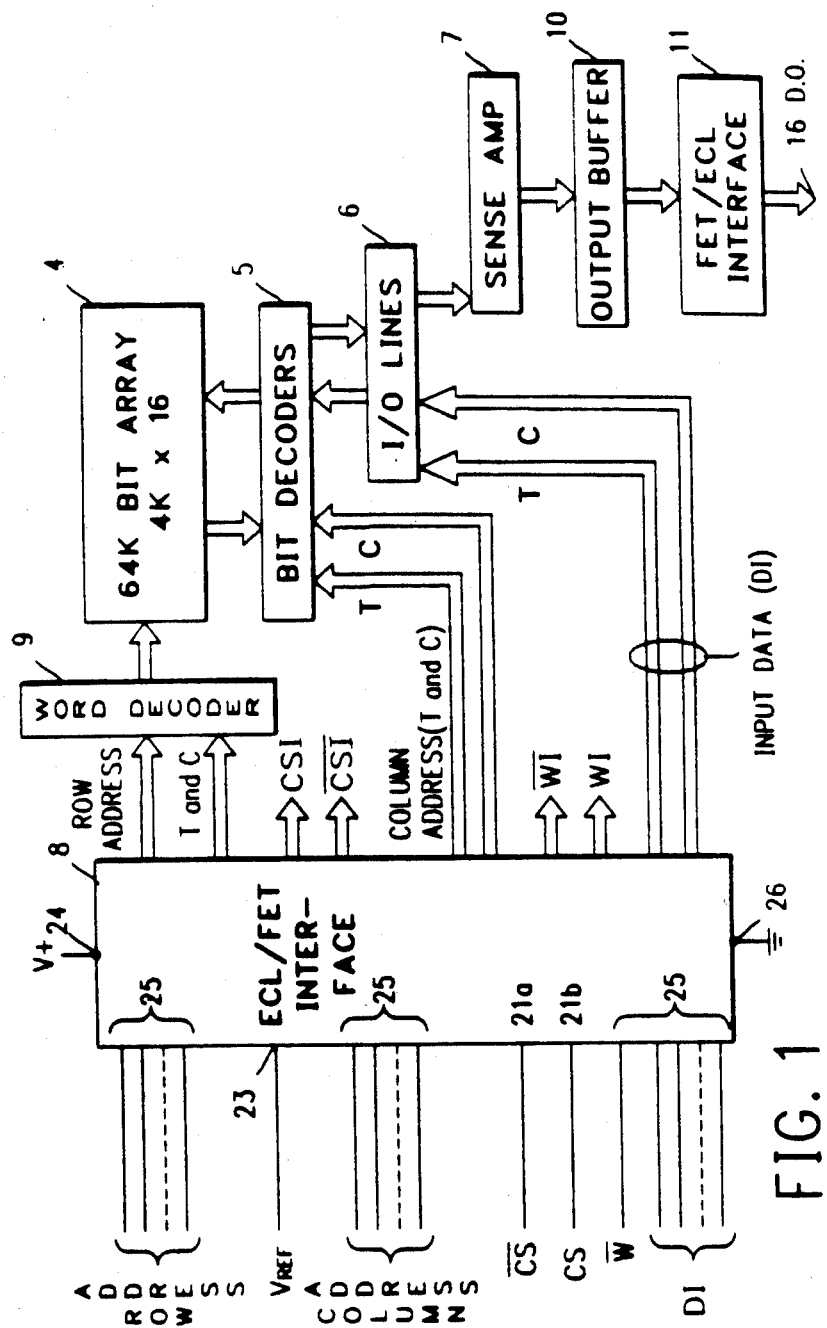
FIG. 1 illustrates a semiconductor memory having an ECL driven interface which is used in explaining the principles of an embodiment of the invention.

Referring now to FIG. 1, there is shown a typical memory architecture for an FET CMOS random access memory. The memory architecture, including the dual rail operation, is shown for purposes of explanation. The present invention may also be used with other memory architectures and with logic circuits and for single rail operation. A 64k bit array 4 contains an array of FET transistors which can be addressed to write or read binary data. The memory shown is row and column addressable.

The structure of FIG. 1 may be entirely fabricated in MOS semiconductor technology, but has the ability to interface with bipolar drive circuitry. In particular, bipolar ECL signal levels are directly interfaced with the memory structure of FIG. 1.

The effective interface between ECL logic and field effect transistor FET logic levels is accomplished by the ECL/FET interface 8 and FET/ECL interface 11. The ECL/FET interface 8, the subject matter of the present invention, will convert all ECL logic levels to FET standard logic levels.

The ECL/FET interface is located on the same substrate as the remaining portion of the memory, thus facilitating an entirely MOS fabricated structure.

The off-chip ECL drive signals are received in the ECL/FET interface 8. These drive signals, which are usual for controlling a memory, include a write signal $\overline{W}$, column address signals, row address signals and data input DI signals. The usual memory control inputs are received on pins which are generically referred to as 25. Each of these inputs is a single ended input for supplying an ECL logic level. The 64K bit memory of FIG. 1 is organized, for purposes of explanation, as 4K by 16 with 7 row addresses and 5 column addresses. The present invention is not restricted to this size memory or organization.

In addition to the single ended standard ECL logic signals used to control the memory, in the described embodiment dual rail clock signals, CS and $\overline{CS}$ are received on pins labeled 21a and 21b. The clock signal is the only signal applied via a dual rail input to the ECL/FET interface. A ground connection 26 and power supply connection V+ 24 are provided for the entire chip.

An additional signal received by the circuit of FIG. 1 on pin 23 is a VREF signal supplied by the ECL logic. The ECL logic states are centered with respect to VREF.

Thus, the ECL/FET interface includes only a single dual rail input, CS and $\overline{CS}$, and a VREF input, for a maximum of two additional pins required to interface the MOS structure of FIG. 1 with ECL drive logic. With these two additional two pins and their associated signals, any number of single ended logic inputs may be interfaced to produce both true and complement (T and C) output logic levels.

Alternatively, only the $\overline{CS}$ signal may be provided, in which case the VREF input is the only additional pin required relative to a standard TTL interface. The remaining portion of FIG. 1 shows the standard architecture for a row and column addressable memory. A 64k bit array 4 is shown comprising a semiconductor memory having a row address driven by word decoder 9, and having a bit decoder 5 driven by the column addresses. Each of the converted ECL logic levels are applied by the interface 8 along with the input data signals. Thus, the memory of FIG. 1 is driven with FET logic levels.

The sense amplifier 7 and output buffer 10 receive stored data from the 64k bit array 4 and provide them to an FET/ECL interface 11. Thus, the data stored as FET logic levels in array 4 is provided as ECL logic levels on output lines 16. Thus, the entire memory of FIG. 1 is made input/output compatible with ECL logic levels.

Figure 2:
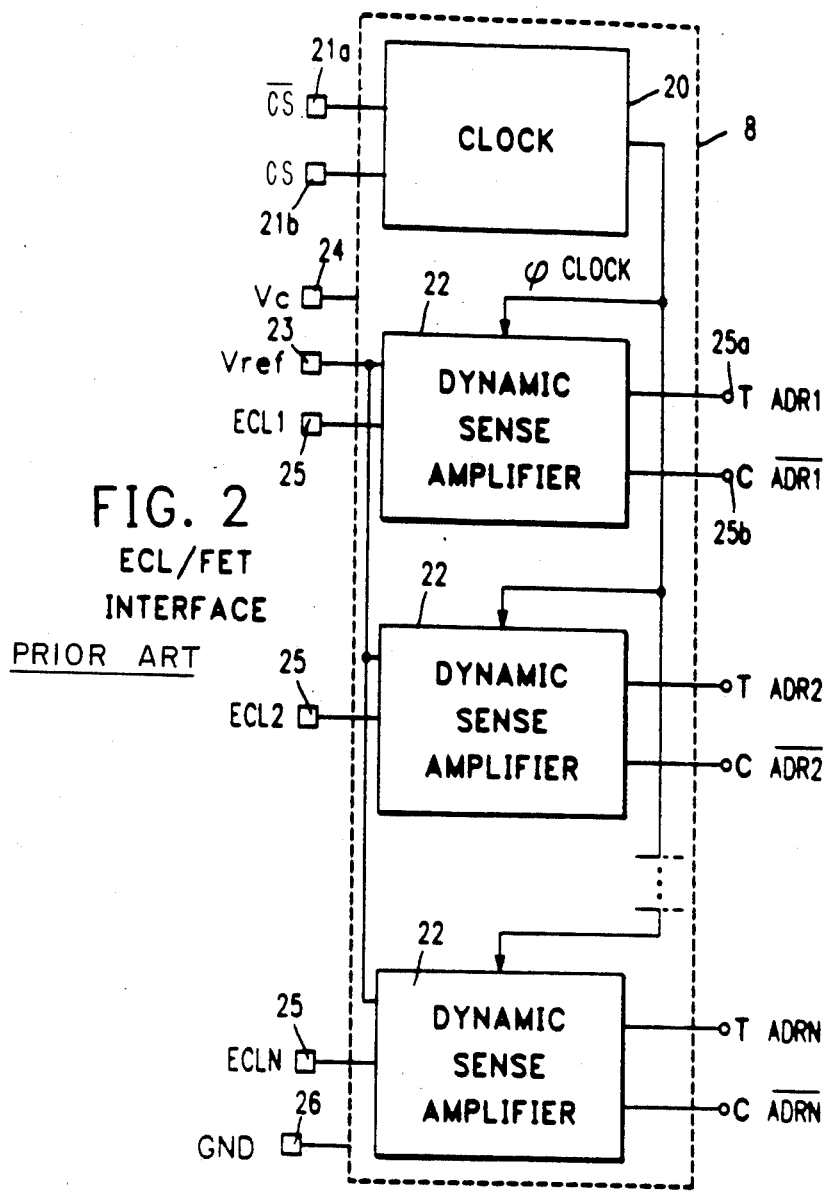
FIG. 2 is a block diagram illustrating an ECL/FET interface for the ECL address and input signals of FIG. 1.

Referring now to FIG. 2, an example of the ECL/FET interface 8 of FIG. 1 is shown. The ECL interface 8 receives the dual rail chip enable signals on pins 21a and 21b. From the dual rail chip select signals, a clock signal φ for clocking in logic states appearing at the input of a plurality of dynamic sense amplifiers 22 is provided. Each dynamic sense amplifier 22 receives on an input thereof an ECL logic level which is to be converted to an FET semiconductor logic level. Additionally, the VREF signal from the ECL logic circuitry establishing a reference voltage for the dynamic sense amplifier is connected to each dynamic sense amplifier 22. With only the connection shown in FIG. 2, it is possible by repeating the dynamic sense amplifier structure 22 to convert any number of single ended ECL logic inputs to a true and complementary FET logic level. As shown in FIG. 2, ECL 1 is applied to pin 25 as a single ended input and the circuit 22 provides both a true and complementary output signal value with full CMOS levels thereon. The circuit pin out overhead utilizing the ECL/FET interface of FIG. 2, includes only a pin for the VREF input 23, and an additional pin for the complement of the chip enable signal, $\overline{CS}$ for a total of two additional pins necessary to provide an ECL-compatible MOS semiconductor random access memory.

An alternative (not shown) is to use a plurality of unclocked interface circuit 20, each having a single-ended input relative to a common VREF. This would be the preferred embodiment for the case wherein a clock signal is not available.

Figure 3:
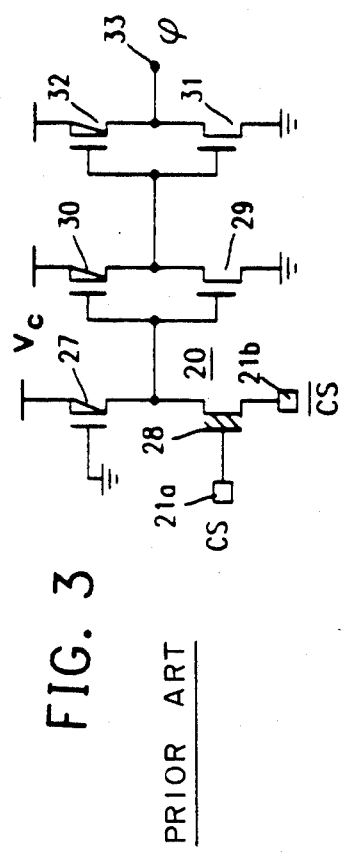
FIG. 3 is a schematic illustration of a prior art embodiment of the dual rail input ECL portion of the clock circuit of FIG. 2 which uses a depletion device.

Referring now to FIG. 3, a prior art multiplier circuit described in the copending application Ser. No. 06/789,884 is shown. In FIG. 3, there is shown the clock circuitry 20 for generating a clock signal φ, used to clock each of the dynamic sense amplifiers 22 (FIG. 2) from the chip select signal CS and its complement, $\overline{CS}$. A first N channel depletion FET 28 receives on its gate connection the CS level and the $\overline{CS}$ logic level on its source connection. A P channel FET 27 serves as a load for the N channel depletion type transistor 28.

The N channel FETs 29 and 31 and P channel FETs 30 and 32 are connected to provide a signal amplifier for driving the clock input of dynamic sense amplifiers 22 of the ECL/FET interface. Terminal 33 of the clock generator 20 provide the required clock signal φ to each of the dynamic sense amplifiers 22.

Figure 4:
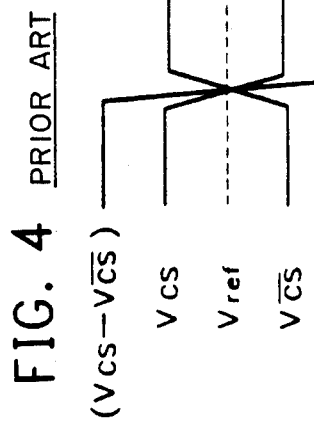
FIG. 4 illustrates the dual rail ECL logic levels CS and $\overline{CS}$ that are applied to the FET interface circuit and the difference between the dual rail ECL logic levels.

The interface circuit of FIG. 3 multiplies the logic level CS to substantially an FET logic level. Referring to FIG. 4, there is shown the voltage levels representing the $\overline{CS}$ logic level, and CS logic level.

The voltage difference between these two signal levels, as shown in FIG. 4, appears across the gate and source of the N channel depletion FET 28. The depletion implant of the channel of FET 28 is chosen so the threshold voltage is approximately equal to VCS−$\overline{VCS}$ where VCS is a low ECL signal level and $\overline{VCS}$ is a high ECL signal level. Since the nominal ECL levels are ±0.5 volts, this gives a depletion threshold of approximately −1 volt. For the case where VCS is low and $\overline{VCS}$ is high, the gate-to-source voltage of FET 28 is 1 volt, which provides a drive voltage (gate-to-source minus threshold voltage) of 2 volts. It should be noted that the input ECL voltage levels of FIG. 2 can shift up or down around the reference voltage level due to power supply variations or noise and the input ECL signal voltage under these worst case conditions can be as small as 0.1 volts with regard to the reference voltage level which is smaller than the threshold variation of an FET device. The worst case situation is addressed by the prior art circuit of FIG. 3 by bringing in CS and $\overline{CS}$ dual rail and taking the difference between these ECL voltage levels, because only the differences in the amplitudes of the two ECL input voltage levels and not the difference between the amplitude and a reference level is of concern. However, transistor 28 of FIG. 3, being a depletion device, requires a depletion implant with the result that variations in the depletion threshold voltage are directly reflected in the minimum amplitude ECL level that can be detected.

Figure 5:
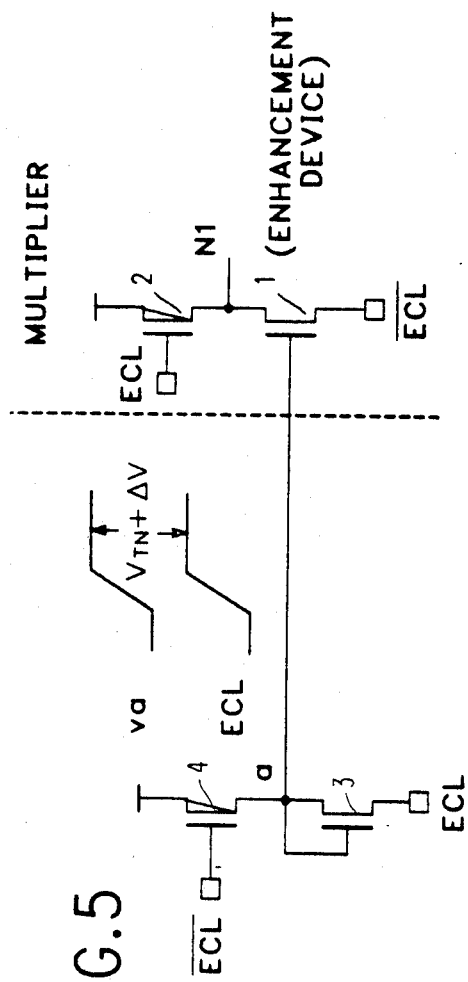
FIG. 5 illustrates a level shifter circuit and multiplier having an enhancement device in accordance with a preferred embodiment of the invention.

Referring now to FIG. 5, a means for shifting the ECL input level by slightly more than an enhancement device threshold is provided. As shown, this is accomplished using a threshold shifting stage, consisting of a load device 4 plus an enhancement device 3 with a common gate and drain and with its source tied to the incoming ECL level. The p-channel load device 4 has its gate modulated by the complement of the incoming signal. The output of this stage, node a, is the ECL signal shifted upwards by slightly more than a threshold voltage, making it possible to drive the next stage without use of a depletion implant in device 1. The level shifted signal is applied to the gate of the n-channel enhancement device 1 in the multiplier stage, with the complement ECL signal applied to device 1 source. The ECL signal is also used to drive the gate of the p-channel load device 2 in the multiplier stage.

Figure 6:
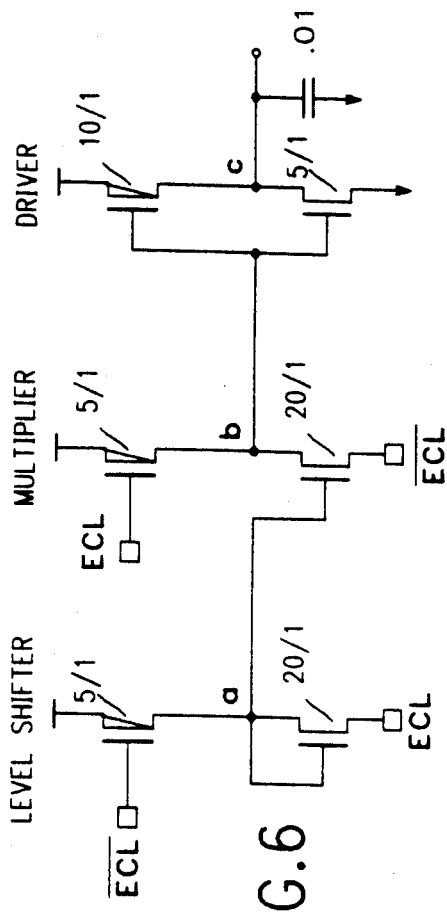
FIG. 6 illustrates the level shifter circuit of FIG. 5 and a driver stage to provide full output levels.
Figure 7:
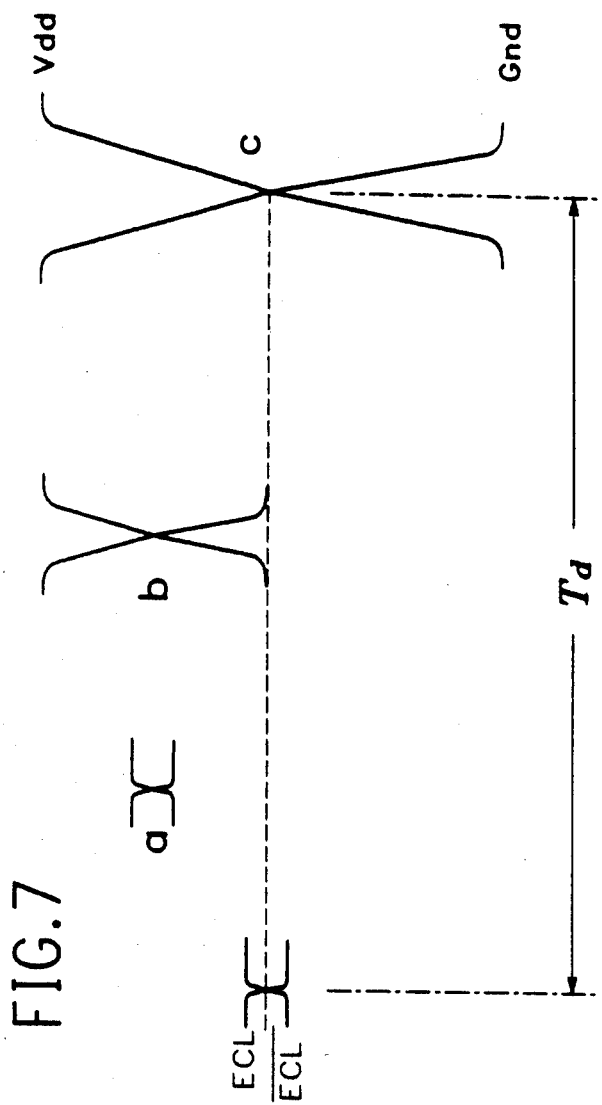
FIG. 7 is an illustration of the waveforms of the voltages at each stage in the circuit of FIG. 6.

As shown in FIG. 6, a drive stage is added to the combination of the level shifter and multiplier to provide a full output voltage level. Thus, conversion from very small input signals to full on-chip swings is accomplished in only three stages. The waveforms for each stage are shown in FIG. 7.

Because of the level shifting scheme, the differential drive configuration, and the small number of devices, the interface circuit shown in FIGS. 5 and 6 provides good self-compensation for the variations of most concern in typical CMOS processes, while also providing very small delays. As described above, the shifted ECL level on node a in FIG. 5 provides a common gate voltage for n-channel transistors 1 and 3, while the sources of these devices are driven by the true and complement of the input signal. Therefore, the large shifts in n-channel threshold voltages or device currents that may be typically seen in CMOS processes have little impact on this circuits' operation. There is a similar effect in p-channel transistors 2 and 4, since they also have a common source and their gates are differentially driven by the incoming signal. Therefore, the sensitivity to power supply variations and to n-device to p-device shifts is substantially eliminated, which is important since these variations may be large relative to the signal amplitude. The circuit is most sensitive to tracking errors between n-channel devices and p-channel devices. If the p-channel load device pair are designed to have larger than minimum device channel lengths, then their sensitivity to tracking error can be substantially reduced without a significant increase in delay. Consequently, there is only one pair of critical devices and these can be of matched physical design and can be placed adjacent to each other. Therefore, the sensitivity to tracking error is well contained and should be small in typical CMOS processes.

Figure 8:
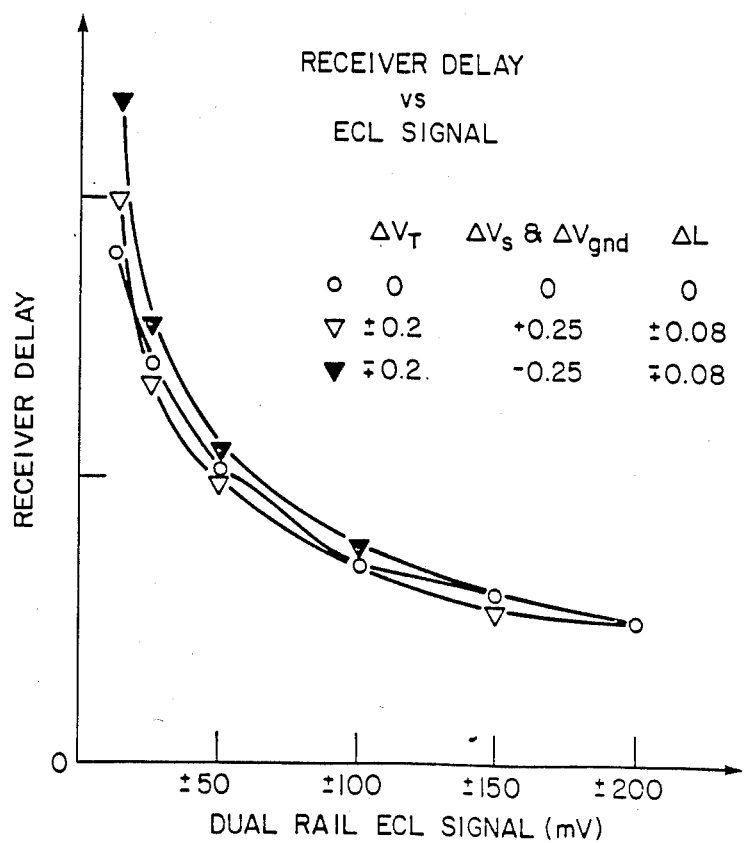
FIG. 8 is a waveform illustrating the relationship between receiver delay and the dual rail ECL signal.
Figure 9:
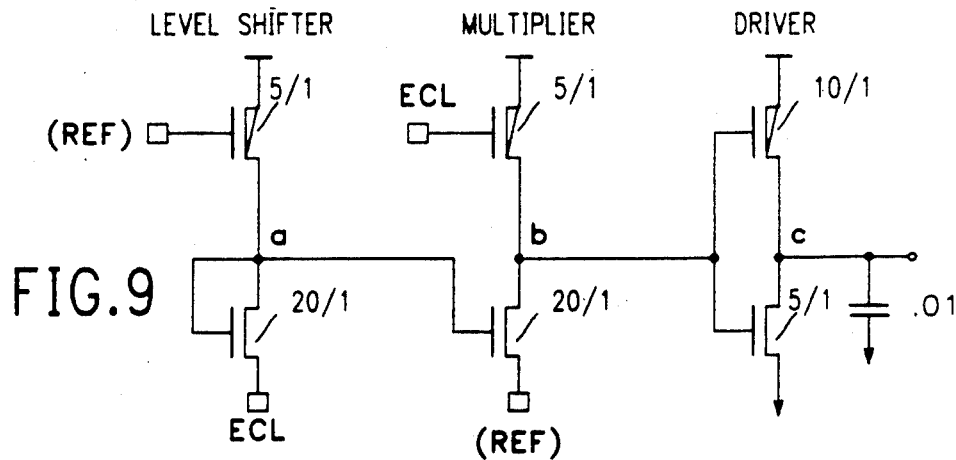
FIG. 9 is a schematic diagram of an embodiment of an interface circuit for single rail mode operation.

The circuit of FIG. 6 can be evaluated based on its speed and sensitivity to technology tolerances. Technology tolerances included threshold and current variations between n and p devices, threshold and current shifts between n and p devices, and shifts in the power supply and ground levels. The plot of receiver delay versus dual rail ECL signal of FIG. 8 for the indicated technology tolerances shows that the circuit is operational for these fairly conservative tolerance even for very small ECL input signals. In fact, the circuit operates well below the 100 mV worst case single rail input level (corresponds to ±50 mV dual rail ECL signal). Therefore, this circuit could be operated in a single rail mode of operation as shown in FIG. 9 with ECL being replaced with the reference level (REF) with a corresponding increase in delay.

What has been described is an improved interface circuit including an amplifier circuit having level shifting and multiplier enhancement devices. The circuit is designed as an interface between small signal levels such as bipolar ECL and FET transistor circuits. The interface circuit may be used in memories and logic devices. While described relative to a dual rail input operation, and with n-channel input devices, the invention may also be used in all single rail systems and employ p-channel input devices.

While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. An interface circuit for driving an FET logic circuit from an ECL transistor logic circuit comprising:
   first and second input terminals for receiving, respectively, a first ECL logic level signal and a second input signal from said ECL transistor logic circuit,
   a level shifting and multiplying circuit for shifting an ECL input level connected to said input terminals including a level shifting stage with a first load transistor having source, gate and drain electrodes, said gate electrode being connected to said second input signal on said second input terminal, and said source electrode connected to a voltage source, and a first enhancement transistor having source, gate and drain electrodes, said gate and drain electrodes of said first enhancement transistor being connected in common to said drain electrode of said first load transistor and said source electrode of said first enhancement transistor being connected to said first ECL logic level signal on said first input terminal and a multiplying stage connected to said common connection of said gate and drain electrodes of said first enhancement transistor and said drain electrode of said first load transistor.

2. An interface circuit according to claim 1 wherein said multiplying stage of said level shifting and multiplying circuit includes a second load transistor having source, gate and drain electrodes, said gate electrode of said second load transistor being connected to said ECL logic level signal on said first input terminal, and said source electrode connected to said voltage source, and a second enhancement transistor having gate, source and drain electrodes, said gate electrode of said second enhancement transistor being connected to said common gate and drain electrode connections of said first enhancement transistor of said level shifting stage, said source electrode of said second enhancement transistor being connected to said second input signal on said second input terminal and said drain electrode of said second enhancement transistor being connected to said drain electrode of said second load transistor at a common output node.

3. An interface circuit according to claim 2 wherein said ECL transistor logic circuit is dual rail and said other input signal on said second input terminal is the complement of said first ECL logic signal on said first input terminal.

4. An interface circuit according to claim 2 wherein said ECL transistor logic circuit is single rail and said other input signal on said second input terminal is a reference voltage level.

5. An interface circuit according to claim 3 wherein said gate electrode of said first load transistor of said level shifting stage of said level shifting and multiplying circuit is modulated by said complement of said ECL logic level signal to provide an enhanced signal on said common gate and drain electrode connection of said first enhancement transistor representative of said ECL logic level signal shifted upwards an amount greater than the threshold voltage of said first enhancement transistor.

6. An interface circuit according to claim 3 wherein said level shifting and multiplying circuit further includes a driver stage having a third load transistor and a third enhancement transistor, each having a gate electrode connected to the drain electrode of said second enhancement transistor of said multiplying stage, and an output terminal connected to said drain electrode of said third enhancement transistor and to a source electrode of said third load transistor and wherein said third enhancement transistor includes a source electrode connected to a potential and said third load transistor has a drain electrode connected to a source of reference potential.

7. An interface circuit according to claim 4 wherein said level shifting and multiplying circuit further includes a driver stage having a third load transistor and a third enhancement transistor, each having a gate electrode connected to the drain electrode of said second enhancement transistor of said multiplying stage, and an output terminal connected to said drain electrode of said third enhancement transistor and to a source electrode of said third load transistor and wherein said third enhancement transistor includes a source electrode connected to a potential and said third load transistor has a drain electrode connected to a source of reference potential.

* * * * *